United States Patent
Liu et al.

(10) Patent No.: US 9,291,894 B2
(45) Date of Patent: Mar. 22, 2016

(54) COLORED PHOTOSENSITIVE RESIN COMPOSITION AND COLORED FILTER AND DISPLAY DEVICE CONTAINING SUCH COMPOSITION

(71) Applicant: BOE TECHNOLOGY GROUP CO., LTD., Beijing (CN)

(72) Inventors: Chen Liu, Beijing (CN); Shi Shu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 168 days.

(21) Appl. No.: 14/240,538

(22) PCT Filed: Dec. 16, 2013

(86) PCT No.: PCT/CN2013/089598
§ 371 (c)(1),
(2) Date: Feb. 24, 2014

(87) PCT Pub. No.: WO2014/190734
PCT Pub. Date: Dec. 4, 2014

(65) Prior Publication Data
US 2015/0153643 A1    Jun. 4, 2015

(30) Foreign Application Priority Data

May 30, 2013    (CN) .......................... 2013 1 0210128

(51) Int. Cl.
| | |
|---|---|
| *G02B 5/23* | (2006.01) |
| *G02F 1/1335* | (2006.01) |
| *G03F 7/00* | (2006.01) |
| *G03F 7/004* | (2006.01) |
| *G03F 7/032* | (2006.01) |
| *G02B 5/22* | (2006.01) |

(Continued)

(52) U.S. Cl.
CPC .............. *G03F 7/0048* (2013.01); *G02B 5/223* (2013.01); *G02F 1/133514* (2013.01); *G02F 1/133516* (2013.01); *G03F 7/004* (2013.01); *G03F 7/0007* (2013.01); *G03F 7/032* (2013.01); *G02F 2202/023* (2013.01)

(58) Field of Classification Search
USPC ........... 252/586; 349/106; 359/891; 427/514; 430/7, 280.1; 522/111
See application file for complete search history.

(56) References Cited

U.S. PATENT DOCUMENTS

2011/0123723 A1* 5/2011 Yang ..................... G03F 7/0007
427/514

FOREIGN PATENT DOCUMENTS

| CN | 101295051 A |   | 10/2008 | |
|---|---|---|---|---|
| CN | 101760042 | * | 6/2010 | .............. C09B 67/20 |

(Continued)

OTHER PUBLICATIONS

International Search Report mailed Mar. 20, 2014; PCT/CN2013/089598.

(Continued)

*Primary Examiner* — Bijan Ahvazi
(74) *Attorney, Agent, or Firm* — Ladas & Parry LLP

(57) ABSTRACT

A colored photosensitive resin composition, and a colored filter and a display device including the same. The colored photosensitive resin composition comprises a pigment dispersion solution, an alkaline soluble resin, a light polymerizable compound, a photoinitiator, an adjuvant and a solvent, wherein the solvent includes 60%-85% of propylene glycol methyl ether acetate and 15%-40% of a dibasic acid ester, based on the total weight of the solvent. The colored photosensitive resin composition has good stability.

13 Claims, 3 Drawing Sheets

(51) Int. Cl.
*G03F 1/00* (2012.01)
*C08J 7/18* (2006.01)
*G03C 1/00* (2006.01)

(56) References Cited

FOREIGN PATENT DOCUMENTS

| CN | 102566270 A | 7/2012 |
| CN | 103045015 A | 4/2013 |
| CN | 103293856 A | 9/2013 |

OTHER PUBLICATIONS

First Chinese Office Action Appln. No. 201310210128.6; Dated Aug. 28, 2014.
International Preliminary Report on Patentability issued Dec. 1, 2015; PCT/CN2013/089598.

* cited by examiner

COLORED PHOTOSENSITIVE RESIN COMPOSITION AND COLORED FILTER AND DISPLAY DEVICE CONTAINING SUCH COMPOSITION

FIELD OF INVENTION

The embodiments of the invention relate to a colored photosensitive resin composition, and a colored filter and a display device containing said composition.

BACKGROUND OF INVENTION

The colored filter is a key component for the liquid crystal display to achieve colored display. Recently, with the rapid popularization of the colored liquid crystal display in the market, the requirements for the color display of the display increasingly rises. The performance of a colored filter is mainly determined by the process for manufacturing it. Currently, the process for preparing a colored filter includes a dyeing method, a pigment dispersion method, a printing method, and an electrodeposition method, and the like. The process that is the most widely used now is the pigment dispersion method. In the pigment dispersion method, an alkaline soluble resin, a binding agent and a monomer solvent are used to disperse the pigment to obtain a colored photosensitive resin composition, which is coated on a transparent substrate. A colored filter with a good film forming property, heat tolerance, solvent tolerance, compatible development property and excellent graphic precision will be formed on the transparent substrate after a serried of processes comprising baking, mask exposure, development, and the like. Each component of the colored photosensitive resin composition directly affects its colorimetric performance.

The practice indicates that the black matrices and the colored resin graphs produced from the colored photosensitive resin composition in the prior art has the problems of poor surface smoothness and residues occurring at the edges, thereby casing an insufficient quality for the produced black matrices and colored resin patterns.

SUMMARY OF INVENTION

An embodiment of the invention provides a colored photosensitive resin composition comprising a pigment dispersion solution, an alkaline soluble resin, a light polymerizable compound, a photoinitiator, an adjuvant, and a solvent, wherein the solvent comprises 60%-85% of propylene glycol methyl ether acetate and 15%-40% of a dibasic acid ester, based on the total weight of the solvent.

For example, the dibasic acid ester may be selected from one or more of dimethyl succinate, diethyl succinate, dibutyl succinate, diisooctyl succinate, dimethyl glutarate, diethyl glutarate, dibutyl glutarate, diisooctyl glutarate, dimethyl adipate, diethyl adipate, dibutyl adipate and diisooctyl adipate.

Wherein the colored photosensitive resin composition comprises 5%-40% of an alkaline soluble resin, 1%-15% of a light polymerizable compound, 4%-45% of a pigment dispersion solution, 0.1%-3% of a photoinitiator, 40%-70% of a solvent and 0.1%-1% of adjuvant, based on the total weight of the colored photosensitive resin composition. Wherein, the pigment dispersion solution comprises 8%-20% of a pigment, 2.5%-10% of a dispersing agent, 1%-6% of a binder resin, and 65%-85% of a solvent, based on the total weight of the pigment dispersion solution.

Wherein, the solvent used in the pigment dispersion solution comprises 60%-85% of propylene glycol methyl ether acetate and 15%-40% of a dibasic acid ester, based on the total weight of solvent.

Wherein, the pigment may be a phthalocyanin, azo, or pyrrolopyrrole type organic pigment.

The dispersing agent may be an amide polymer, a modified polyurethane polymer or an acrylate block copolymer.

The binder resin may be an epoxy resin.

Wherein, the alkaline soluble resin may be an aromatic acid acrylate ester, a copolymer of styrene and maleic anhydride, a polyurethane acrylate, a hydroxy-containing polyester acrylate ester, or a combination thereof.

Wherein, the light polymerizable compound may be an ethylene analog, a maleimide, or a phthalimide, or a combination thereof.

Wherein, the photoinitiator may be an acetophenone, an aromatic ketone, an aromatic sulfonium salt, iodonium salt, or a cyclopentadienyl iron salt.

Wherein, the adjuvant may be selected from at least one of an ultraviolet absorbent, an organic silicon leveling agent, a silicone leveling agent, a diphenyl polysiloxane, a methylphenyl polysiloxane, an organic modified siloxane, or an organic modified fluorosiloxane.

Another embodiment of the invention provides a colored filter.

The colored filter provided in the invention comprises a colored film, wherein the color film is made from the aforesaid colored photosensitive resin composition.

Another embodiment of the invention provides a display device comprising the aforesaid colored filter.

DETAILED DESCRIPTION OF INVENTION

Figure 1:
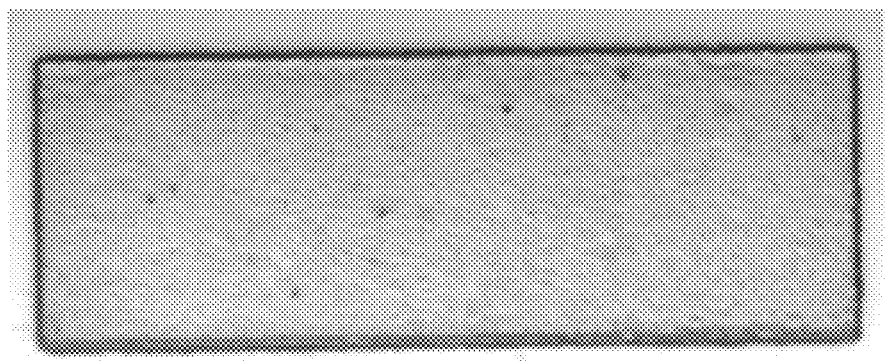
FIG. 1 is a schematic diagram of a glass substrate coated with the red photosensitive resin composition prepared in the Comparative Example 1.

The colored photosensitive resin composition of the embodiments of the invention comprises a pigment dispersion solution, an alkaline soluble resin, a light polymerizable compound, a photoinitiator, and an adjuvant and a solvent, wherein, based on the total weight of the solvent, the solvent comprises 60%-85% of propylene glycol methyl ether acetate and 15%-40% of a dibasic acid ester.

For example, the dibasic acid ester may be selected from one or more of dimethyl succinate, diethyl succinate, dibutyl succinate, diisooctyl succinate, dimethyl glutarate, diethyl glutarate, dibutyl glutarate, diisooctyl glutarate, dimethyl adipate, diethyl adipate, dibutyl adipate and diisooctyl adipate.

In the invention, the surface fluidity of the colored photosensitive resin composition can be controlled by improving the composition of the solvent. The surface fluidity of the coating can be adjusted through eliminating the differences in the surface tension so as to level the coating. Therefore, the colored filter produced using the colored photosensitive resin composition of the invention has a colored film with an enhanced surface evenness, a reduction of residues at the edges, and an improvement of the edge evenness.

For example, based on the total weight of the colored photosensitive resin composition, the colored photosensitive resin composition comprises 5%-40% of an alkaline soluble resin, 1%-15% of a light polymerizable compound, 4%-45% of a pigment dispersion solution, 0.1%-3% of a photoinitiator, 40%-70% of a solvent and 0.1%-1% of an adjuvant.

Wherein, the pigment dispersion solution, the alkaline soluble resin, the light polymerizable compound, the photoinitiator, and the adjuvant are all known in the art. Herein some examples are shown for the pigment dispersion solution, the alkaline soluble resin, the light polymerizable compound, the photoinitiator, and the adjuvant, but the invention is not limited to those. For example, the pigment dispersion solution, based on the total weight of pigment dispersion solution, may comprise 8%-20% (for example, 10%, 12%, 14%, 16%, 18%) of a pigment, 2.5%-10% (for example, 4%, 6%, 8%) of a dispersing agent, 1%-6% (for example, 2%, 3%, 4%, 5%) of a binder resin, and 65%-85% (for example, 70%, 75%, 80%) of a solvent, wherein based on the total weight of the solvent, the solvent comprises 60%-85% of propylene glycol methyl ether acetate and 15%-40% of a dibasic acid ester. Using a mixed solvent in the pigment dispersion solution may improve the stability of the pigment dispersion solution, and the composition and content of the solvent used in the pigment dispersion solution is the same as the composition and content of the solvent in the colored photosensitive resin composition. Therefore, the compatibility between the pigment dispersion solution and the colored photosensitive resin composition can be improved. Wherein, the pigment may be a phthalocyanin, azo, or pyrrolopyrrole type organic pigment. The dispersing agent may be an amide polymer, a modified polyurethane polymer or an acrylate block copolymer. The binder resin may be an epoxy resin, such as the dispersion resin 2388. The alkaline soluble resin may be an aromatic acid acrylate ester, a copolymer of styrene and maleic anhydride, a polyurethane acrylate, a hydroxy-containing polyester acrylate ester, or a combination thereof. The light polymerizable compound may be an ethylene analog, a maleimide, or a phthalimide, or a combination thereof. The photoinitiator may be an acetophenone, an aromatic ketone, an aromatic sulfonium salt, iodonium salt, or a cyclopentadienyl iron salt. The adjuvant may be selected from at least one of an ultraviolet absorbent, an organic silicon leveling agent, a silicone leveling agent, a diphenyl polysiloxane, a methylphenyl polysiloxane, an organic modified siloxane, or a fluorosiloxane. As to the aforesaid components used in the colored photosensitive resin composition, a person skilled in the art can easily select their specific type and manufacture which are not repeated here.

Based on practical need, the colored photosensitive composition may further comprise one or more additives such as the additive KH560 (epoxypropyloxytrimethoxysilane available from Shin-Etsu Chemical, Japan) and/or the additive DL602 (aminopropylmethyldimethoxysilane available from Shin-Etsu Chemical, Japan). When present, their contents may both be 0.05-1.5% based ob the total weight of the colored photosensitive composition.

The colored photosensitive composition may be mixed by a general method in the art, without any paticular limitation. The colored photosensitive resin composition of the invention can be used to prepare a colored filter. The process for manufacturing the colored filter is a conventional technique in the art, without any particular limitation.

An embodiment of the invention also provides a display device comprising any one of the aforesaid colored filter.

The colored photosensitive resin composition of the embodiments of the invention has good stability. The colored filter prepared using the colored photosensitive resin composition of the invention has a colored film with an enhanced surface evenness, a reduction of residues at the edges, and an improvement of the edge evenness, thereby greatly enhancing its quality.

The colored photosensitive resin composition of the invention will be better described below by way of specific examples. The examples below are made with a red photosensitive resin as an example. Photosensitive resins of other colors can be made by selecting the pigment dispersion solution and are not limited here.

EXAMPLE

The types and sources of the components used in the Comparative Examples and Examples in the invention are listed below:

The dispersing agent BYK2001: it is an acrylate block copolymer obtained from Byk.

The dispersion resin 2388: it is an epoxy resin obtained from BASF.

The red pigment PR254: it is an organic azo pigment obtained from BASF.

The alkaline soluble resin SB401: it is an aromatic acid methacrylate hemiester obtained from Sartomer.

The light polymerizable compound DPHA: it is a dipentaerythritol pentaacrylate obtained from Nanjing Jinlu Chemical.

The photoinitiator 379: it is 2-(4-methylbenzyl)-2-(dimethylamino)-1-(4-morpholinophenyl)-1-butanone obtained from BASF.

The adjuvant 361N: it is an acrylate obtained from Byk.

The adjuvant 432: it is a polyether siloxane copolymer obtained from Tego

Comparative Example 1

Red Photosensitive Resin Composition

1. Preparation of a Red Pigment Dispersion Solution:
a: 80 g dispersing agent BYK2001, 40 g dispersion resin 2388, and 350 g solvent propylene glycol methyl ether acetate were mixed and agitated for 1 hour;
b: 100 g red pigment PR254 was added to the dispersion solution prepared in step a and agitated for 1 hour; and
c: 500 g solvent propylene glycol methyl ether acetate was added to the dispersion solution prepared in step b, triturated and dispersed for 2 hours;

2. Preparation of the Red Photosensitive Resin Composition:
200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent propylene glycol methyl ether acetate were mixed and agitated for 5 hours to provide the red photosensitive resin composition.

Comparative Example 2

Red Photosensitive Resin Composition

1. Preparation of a red pigment dispersion solution:
a: 80 g dispersing agent BYK2001, 40 g dispersion resin 2388, and 350 g solvent propylene glycol methyl ether acetate were mixed and agitated for 1 hour;
b: 100 g red pigment PR254 was added to the dispersion solution prepared in step a and agitated for 1 hour; and
c: 500 g solvent propylene glycol methyl ether acetate was added to the dispersion solution prepared in step b, triturated and dispersed for 2 hours;
2. Preparation of the Red Photosensitive Resin Composition:
200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent were mixed and agitated for 5 hours to provide the red photosensitive resin composition, wherein based on the total weight of the solvent, the solvent comprises 80% of propylene glycol methyl ether acetate, 15% of dimethyl succinate, and 5% of dimethyl glutarate.

Comparative Example 3

Red Photosensitive Resin Composition

1. Preparation of a red pigment dispersion solution:
a: 80 g dispersing agent BYK2001, 40 g dispersion resin 2388, and 350 g solvent were mixed and agitated for 1 hour, wherein based on the total weight of the solvent, the solvent comprises 90% of propylene glycol methyl ether acetate, 5% of dimethyl succinate, and 5% of dimethyl glutarate;
b: 100 g red pigment PR254 was added to the dispersion solution prepared in step a and agitated for 1 hour; and
c: 500 g solvent was added to the dispersion solution prepared in step b, triturated and dispersed for 2 hours, wherein based on the total weight of the solvent, the solvent comprises 90% of propylene glycol methyl ether acetate, 5% of dimethyl succinate, and 5% of dimethyl glutarate;
2. Preparation of the Red Photosensitive Resin Composition:
200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent were mixed and agitated for 5 hours to provide the red photosensitive resin composition, wherein based on the total weight of the solvent, the solvent comprises 90% of propylene glycol methyl ether acetate, 5% of dimethyl succinate, and 5% of dimethyl glutarate.

Example 1

Red Photosensitive Resin Composition

1. Preparation of a red pigment dispersion solution:
a: 80 g dispersing agent BYK2001, 40 g dispersion resin 2388, and 350 g solvent were mixed and agitated for 1 hour, wherein based on the total weight of the solvent, the solvent comprises 80% of propylene glycol methyl ether acetate, 15% of dimethyl succinate, and 5% of diisooctyl glutarate;
b: 100 g red pigment PR254 was added to the dispersion solution prepared in step a and agitated for 1 hour; and
c: 500 g solvent was added to the dispersion solution prepared in step b, triturated and dispersed for 2 hours, wherein based on the total weight of the solvent, the solvent comprises 80% of propylene glycol methyl ether acetate, 15% of dimethyl succinate, and 5% of diisooctyl glutarate;
2. Preparation of the Red Photosensitive Resin Composition:
200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent were mixed and agitated for 5 hours to provide the red photosensitive resin composition, wherein based on the total weight of the solvent, the solvent comprises 80% of propylene glycol methyl ether acetate, 15% of dimethyl succinate, and 5% of diisooctyl glutarate.

Example 2

Red Photosensitive Resin Composition

1. Preparation of a Red Pigment Dispersion Solution
a: 80 g dispersing agent BYK2001, 40 g dispersion resin 2388, and 350 g solvent were mixed and agitated for 1 hour, wherein based on the total weight of the solvent, the solvent comprises 75% of propylene glycol methyl ether acetate, 15% of dimethyl succinate, 5% of dimethyl adipate, and 5% of diisooctyl succinate;
b: 100 g red pigment PR254 was added to the dispersion solution prepared in step a and agitated for 1 hour; and
c: 500 g solvent was added to the dispersion solution prepared in step b, triturated and dispersed for 2 hours, wherein based on the total weight of the solvent, the solvent comprises 75% of propylene glycol methyl ether acetate, 15% of dimethyl succinate, 5% of dimethyl adipate, and 5% of diisooctyl succinate;
2. Preparation of the Red Photosensitive Resin Composition:
200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent were mixed and agitated for 5 hours to provide the red photosensitive resin composition, wherein based on the total weight of the solvent, the solvent comprises 75% of propylene glycol methyl ether acetate, 15% of dimethyl succinate, 5% of dimethyl adipate, and 5% of diisooctyl succinate.

Example 3

Red Photosensitive Resin Composition

1. Preparation of a red pigment dispersion solution:
a: 80 g dispersing agent BYK2001, 40 g dispersion resin 2388, and 350 g solvent were mixed and agitated for 1 hour, wherein based on the total weight of the solvent, the solvent comprises 85% of propylene glycol methyl ether acetate, 10% of dimethyl succinate, and 5% of diisooctyl glutarate;
b: 100 g red pigment PR254 was added to the dispersion solution prepared in step a and agitated for 1 hour; and
c: 500 g solvent was added to the dispersion solution prepared in step b, triturated and dispersed for 2 hours, wherein based on the total weight of the solvent, the solvent comprises 85% of propylene glycol methyl ether acetate, 10% of dimethyl succinate, and 5% of diisooctyl glutarate;

2. Preparation of the Red Photosensitive Resin Composition:

200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent were mixed and agitated for 5 hours to provide the red photosensitive resin composition, wherein based on the total weight of the solvent, the solvent comprises 85% of propylene glycol methyl ether acetate, 10% of dimethyl succinate, and 5% of diisooctyl glutarate.

Example 4

Red Photosensitive Resin Composition

1. Preparation of a red pigment dispersion solution:

a: 80 g dispersing agent BYK2001, 40 g dispersion resin 2388, and 350 g solvent were mixed and agitated for 1 hour, wherein based on the total weight of the solvent, the solvent comprises 60% of propylene glycol methyl ether acetate, 15% of dimethyl succinate, 10% of dimethyl adipate, and 15% of diisooctyl succinate;

b: 100 g red pigment PR254 was added to the dispersion solution prepared in step a and agitated for 1 hour; and c: 500 g solvent was added to the dispersion solution prepared in step b, triturated and dispersed for 2 hours, wherein based on the total weight of the solvent, the solvent comprises 60% of propylene glycol methyl ether acetate, 15% of dimethyl succinate, 10% of dimethyl adipate, and 15% of diisooctyl succinate;

2. Preparation of the Red Photosensitive Resin Composition:

200 g aforesaid prepared red pigment dispersion solution, 75 g alkaline soluble resin SB401, 25 g light polymerizable compound DPHA, 6 g photoinitiator 379, 8 g adjuvant 361N, 4 g adjuvant 432, and 450 g solvent were mixed and agitated for 5 hours to provide the red photosensitive resin composition, wherein based on the total weight of the solvent, the solvent comprises 60% of propylene glycol methyl ether acetate, 15% of dimethyl succinate, 10% of dimethyl adipate, and 15% of diisooctyl succinate.

Application Examples

The red photosensitive resin composition prepared according to the aforesaid Comparative Examples 1-3 and Examples 1-4 were used to make colored filters following the steps below:

Step 1: the photosensitive resin composition was coated on the glass substrate;

Step 2: the glass substrate obtained in step 1 was pre-baked at a temperature of 150° C. for 2 minutes before being subjected to ultraviolet exposure at an exposure energy of 150 mJ/cm$^2$;

Step 3: the glass after step 2 was developed in an alkaline developing solution and then baked at a temperature of 250° C. for 30 minutes to provide the colored filters.

Figure 2:
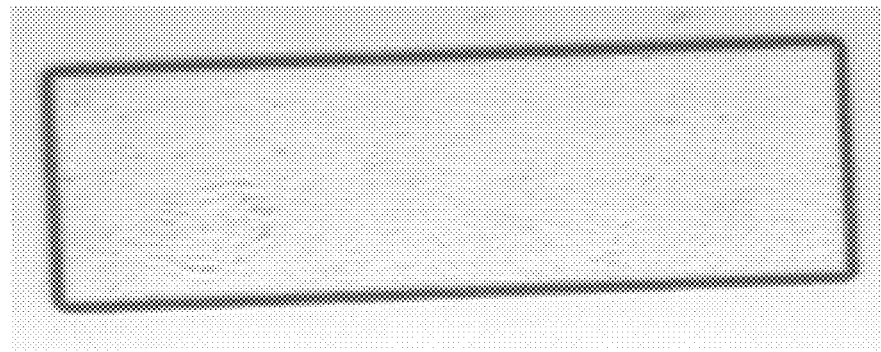
FIG. 2 is a schematic diagram of a glass substrate coated with the red photosensitive resin composition prepared in the Comparative Example 2.
Figure 3:
FIG. 3 is a schematic diagram of a glass substrate coated with the red photosensitive resin composition prepared in the Comparative Example 3.
Figure 4:
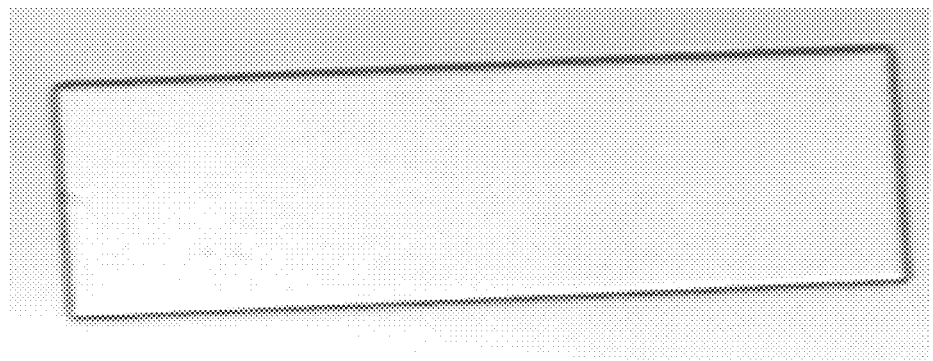
FIG. 4 is a schematic diagram of a glass substrate coated with the red photosensitive resin composition prepared in the Example 1 of the invention.
Figure 5:
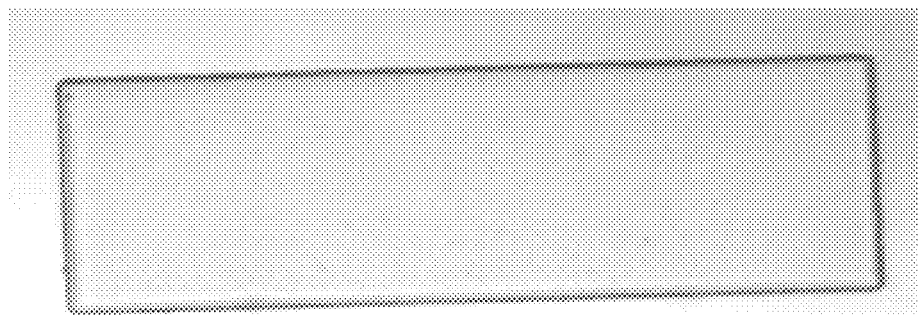
FIG. 5 is a schematic diagram of a glass substrate coated with the red photosensitive resin composition prepared in the Example 2 of the invention.
Figure 6:
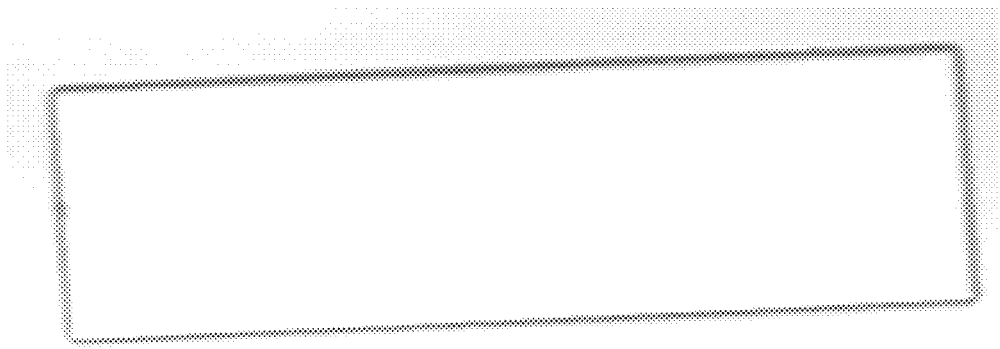
FIG. 6 is a schematic diagram of a glass substrate coated with the red photosensitive resin composition prepared in the Example 3 of the invention.
Figure 7:
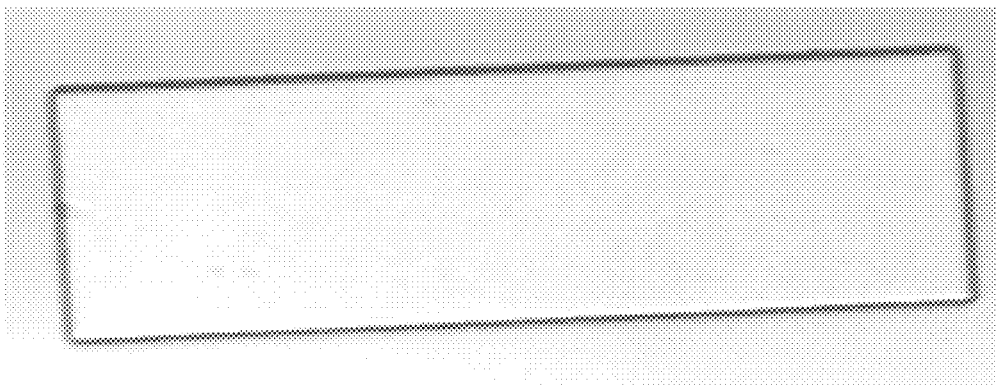
FIG. 7 is a schematic diagram of a glass substrate coated with the red photosensitive resin composition prepared in the Example 4 of the invention.

FIGS. 1-7 show photographs of the colored filters prepared according to Comparative Examples 1-3 and Examples 1-4. FIG. 1 is the photograph of the colored filter prepared according to Comparative Example 1, FIG. 2 is the photograph of the colored filter prepared according to Comparative Example 2, and FIG. 3 is the photograph of the colored filter prepared according to Comparative Example 3. From FIGS. 1-3, it can be seen that the colored film surfaces of the colored filters all have different extent of unevenness, and slight glitches present on the edges. FIG. 4 is the photograph of the colored filter prepared according to Example 1, FIG. 5 is the photograph of the colored filter prepared according to Example 2, FIG. 6 is the photograph of the colored filter prepared according to Example 3, and FIG. 7 is the photograph of the colored filter prepared according to Example 4. From FIGS. 4-7, it can be seen that the color filters have even colored film surfaces and even edges.

The aforesaid results indicate that the colored photosensitive resin compositions provided in the invention have the advantages of improved colored film surface evenness and edge evenness, thereby capable of improving the quality of the colored filter.

The invention further provides a display device comprising any one of the aforesaid colored filter.

Finally, it should be noted that the aforesaid examples are merely used to illustrate, but not to limit the embodiments of the invention. Although the invention was illustrated in details with reference to the aforesaid examples, a person of ordinary skill in the art should understand that the technical solutions recited in the aforesaid various examples can be modified, or a portion of technical features of them can be replaced with equivalents, while these modification and replacement will not make the nature of the corresponding technical solutions to depart from the spirits and scopes of the technical solutions of the various examples of the invention.

What is claimed is:

1. A colored photosensitive resin composition comprising 4%-45% of a pigment dispersion solution,
5%-40% of an alkaline soluble resin, a
1%-15% of a light polymerizable compound, a
0.1%-3% of a photoinitiator,
0.1%-1% of an adjuvant and
40%-70% of a solvent based on the total weight of the colored photosensitive resin composition, wherein the solvent consisting essentially of 60%-85% of propylene glycol methyl ether acetate and 15%-40% of a dibasic acid ester, based on the total weight of the solvent.

2. The colored photosensitive resin composition according to claim 1, wherein the dibasic acid ester is selected from one or more of dimethyl succinate, diethyl succinate, dibutyl succinate, diisooctyl succinate, dimethyl glutarate, diethyl glutarate, dibutyl glutarate, diisooctyl glutarate, dimethyl adipate, diethyl adipate, dibutyl adipate, and diisooctyl adipate.

3. The colored photosensitive resin composition according to claim 1, wherein the pigment dispersion solution comprises 8%-20% of a pigment, 2.5%-10% of a dispersing agent, 1%-6% of a binder resin, and 65%-85% of a solvent, based on the total weight of the pigment dispersion solution.

4. The colored photosensitive resin composition according to claim 3, wherein the solvent consisting essentially of 60%-85% of propylene glycol methyl ether acetate and 15%-40% of a dibasic acid ester, based on the total weight of the solvent.

5. The colored photosensitive resin composition according to claim 3, wherein the pigment is a phthalocyanin, azo, or pyrrolopyrrole organic pigment.

6. The colored photosensitive resin composition according to claim 3, wherein the dispersing agent is amide polymer, a modified polyurethane polymer or an acrylate block copolymer.

7. The colored photosensitive resin composition according to claim 3, wherein the binder resin is an epoxy resin.

8. The colored photosensitive resin composition according to claim 1, wherein the alkaline soluble resin is an aromatic acid acrylate ester, a copolymer of styrene and maleic anhydride, a polyurethane acrylate, a hydroxy-containing polyester acrylate ester, or a combination thereof.

9. The colored photosensitive resin composition according to claim 1 wherein the light polymerizable compound is a maleimide, or a phthalimide, or a combination thereof.

10. The colored photosensitive resin composition according to claim 1, wherein the photoinitiator is an acetophenone, an aromatic ketone, an aromatic sulfonium salt, iodonium salt, or a cyclopentadienyl iron salt.

11. The colored photosensitive resin composition according to claim 1, wherein the adjuvant is selected from at least one of an ultraviolet absorbent, an organic silicon leveling agent, a silicone leveling agent, a diphenyl polysiloxane, a methylphenyl polysiloxane, an organic modified siloxane, or an organic modified fluorosiloxane.

12. A colored filter comprising a color film, wherein the colored film is made from the colored photosensitive resin composition according to claim 1.

13. A display device, comprising the colored filter according to claim 12.

* * * * *